United States Patent [19]
Ollendick

[11] Patent Number: 4,922,251
[45] Date of Patent: May 1, 1990

[54] ANALOG TO DIGITAL INTERFACE CIRCUIT

[75] Inventor: Gary B. Ollendick, Mundelein, Ill.

[73] Assignee: American Telephone and Telegraph Company, New York, N.Y.

[21] Appl. No.: 277,834

[22] Filed: Nov. 30, 1988

[51] Int. Cl.⁵ .............................................. H03M 1/06
[52] U.S. Cl. .................................... 341/155; 341/133; 341/119
[58] Field of Search ............... 341/155, 133, 135, 157, 341/118, 119, 126

[56] References Cited

U.S. PATENT DOCUMENTS

| | | | |
|---|---|---|---|
| Re. 28,633 | 11/1975 | Pastoriza | 341/119 X |
| 4,559,522 | 12/1985 | Sekino et al. | 341/133 |
| 4,560,975 | 12/1985 | Jarva | 341/119 X |
| 4,563,670 | 1/1986 | Stallkamp et al. | 341/119 |
| 4,686,508 | 8/1987 | van de Grift et al. | 341/133 X |

Primary Examiner—William M. Shoop, Jr.
Assistant Examiner—Sharon D. Logan
Attorney, Agent, or Firm—A. A. Tirva

[57] ABSTRACT

An analog to digital interface circuit includes two matched, symmetrical, differential amplifiers which in response to an analog signal having a rising edge and a falling edge produce first and second output signals which are identical but 180° out of phase; whereby the rising edge of the analog signal corresponds to the rising edge of the first output signal, the falling edge of the analog signal corresponds to the rising edge of the second output signal and the time interval between the rising edges of the two output signals is equal to the time interval between the rising and falling edges of the analog signal. The outputs of the differential amplifiers are further processed by two matched, symmetrical buffers which produce first and second digital signals having like falling edges corresponding to the rising and falling edges of the analog signal, respectively. Control pulses generated off the like edges of the two digital signals are used as inputs to digital logic to reconstruct the analog signal or generate clock pulses.

13 Claims, 2 Drawing Sheets

ANALOG TO DIGITAL INTERFACE CIRCUIT

TECHNICAL FIELD

This invention relates to logic circuits and more particularly to analog to digital interface circuits made therefrom suitable for fabrication by integrated circuit techniques.

BACKGROUND OF THE INVENTION

Analog to digital interface circuits for transforming analog signals to digital signals are widely used in transmission systems requiring reception and regeneration of signals when they are transmitted from one location to another, as well as, for generation of clock pulses in response to sinusoidal stimulus.

Conventional analog to digital interface circuits utilized to accomplish the above-identified tasks may include a comparator such as a differential amplifier for amplification of a small signal and a buffer such as a Schmitt trigger for further amplification of the signal and establishment of logic levels. Often such interface circuits are exposed to varying environmental conditions such as temperature variations, power supply fluctuations and component processing variations. The above-identified conditions may cause variations in the signal rise and fall times and also in the device decision levels resulting in signal time interval distortions. Thus in existing circuits, environmental conditions such as temperature variations, power supply fluctuations and component processing characteristics must be closely controlled to minimize time interval distortion. Attempts to stabilize such variations significantly increase the cost of such interface circuits. The above described problems become especially acute when the interface circuits are implemented in a low voltage CMOS technology which imposes additional constraints on the differential amplifier design and wherein logic rise and fall times are affected by p and n channel process variations.

DISCLOSURE OF THE INVENTION

In accordance with the present invention, I provide an analog to digital interface circuit having two matched, symmetrical, differential amplifiers which in response to an analog signal having a rising edge and a falling edge produce first and second output signals which are identical but 180° out of phase; whereby the rising edge of the analog signal corresponds to the rising edge of the first output signal, the falling edge of the analog signal corresponds to the rising edge of the second output signal and the time interval between the rising edges of the two output signals is equal to the time interval between the rising and falling edges of the analog signal. The outputs of the differential amplifiers are further processed by two matched, symmetrical buffers which produce first and second digital signals having like falling edges corresponding to the rising and falling edges of the analog signal, respectively. Control pulses generated off the like edges of the two digital signals are used as inputs to digital logic to reconstruct the analog signal or generate clock pulses.

THE DRAWING

DETAILED DESCRIPTION

Figure 1:
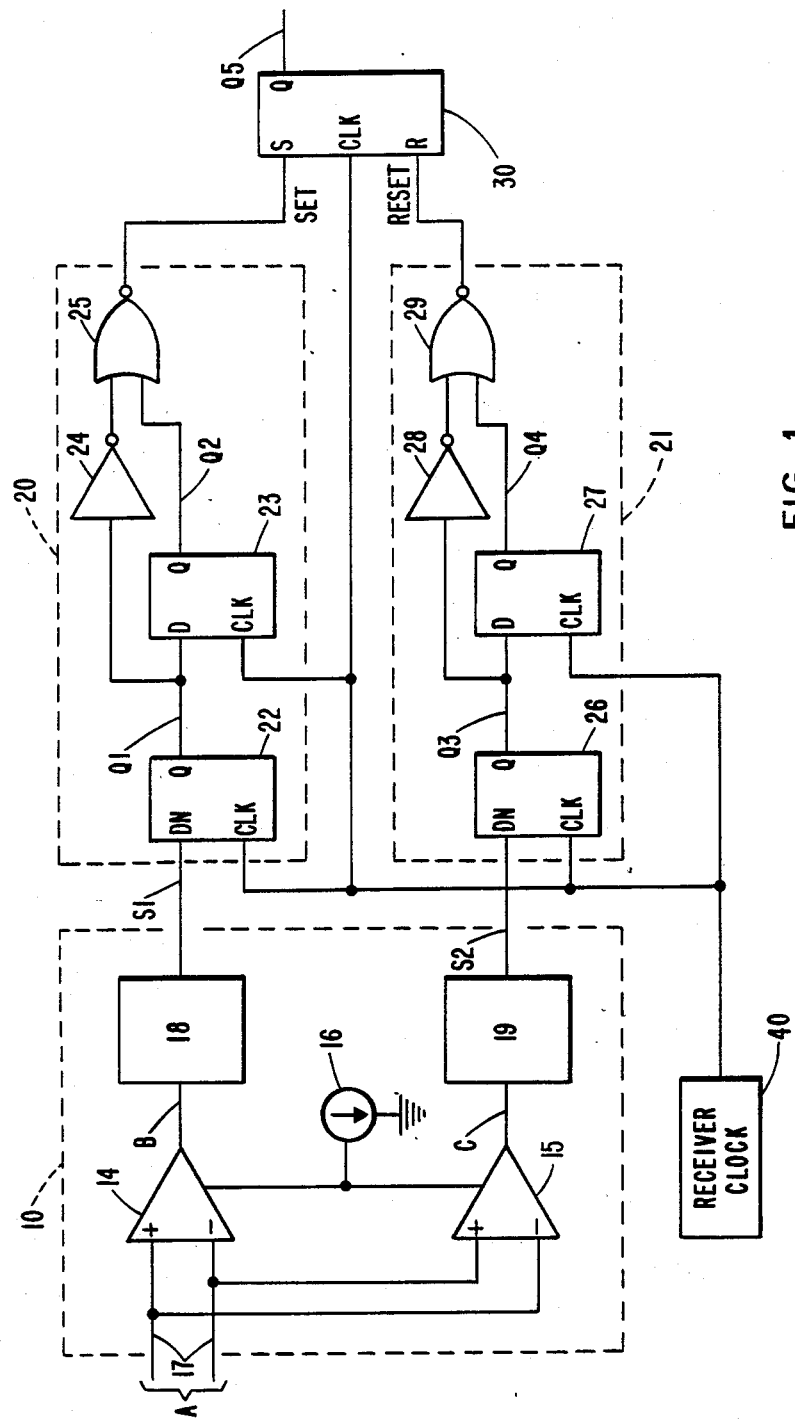
FIG. 1 is a circuit diagram of an analog to digital interface circuit incorporating certain features of this invention.
Figure 2:
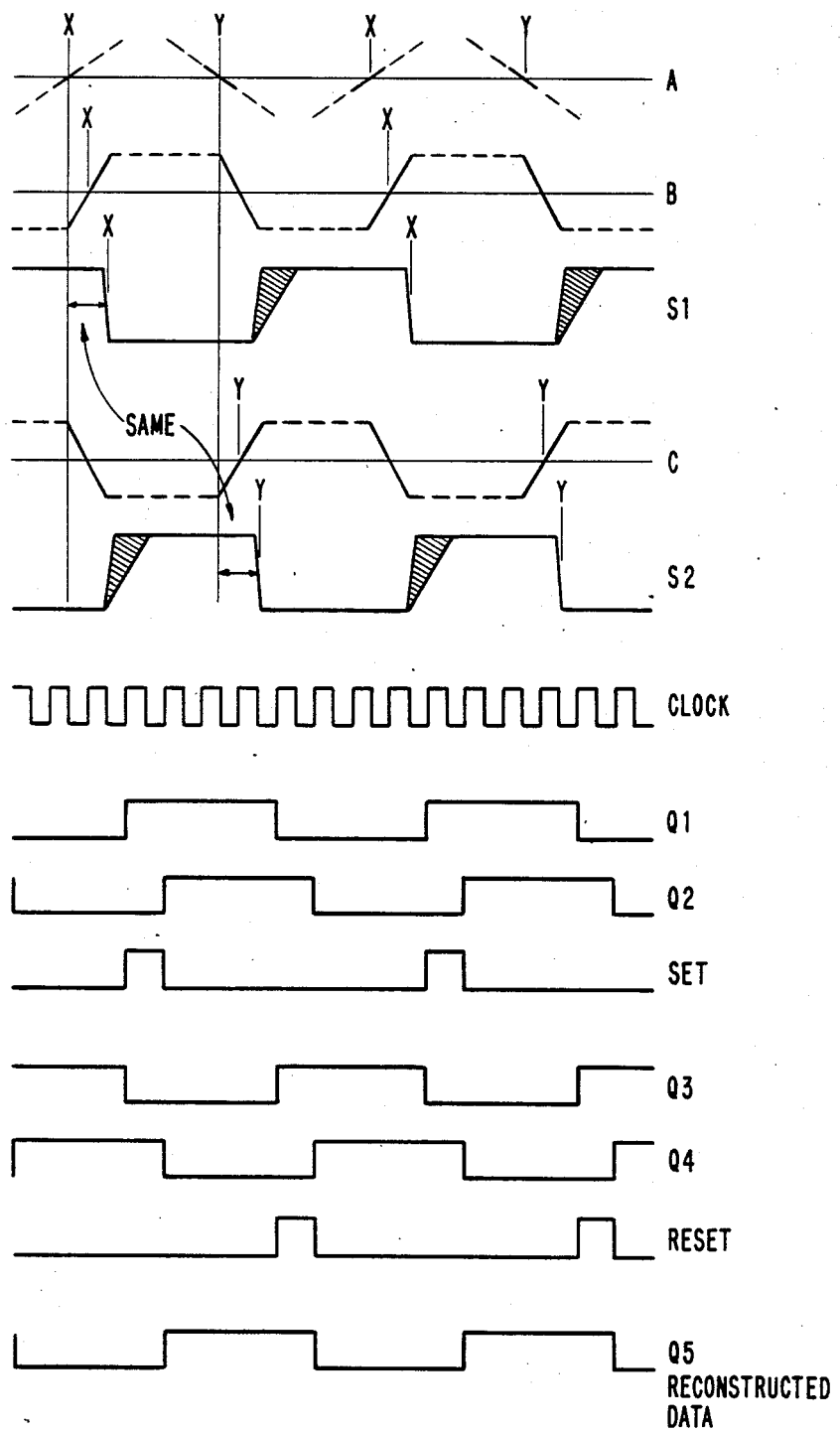
FIG. 2 is a timing diagram of selected signal levels of the circuit of FIG. 1.

As illustrated in FIG. 1, an analog to digital interface circuit 10 includes a matched, physically symmetrical set of differential pairs 14 and 15 (amplifiers) biased with a common constant current source 16 to ensure identical electrical characteristics. The differential amplifiers 14 and 15 receive an incoming analog signal A at a common input 17, signal A having a rising edge X and a falling edge Y as shown in FIG. 2. Due to the interconnections between the amplifiers 14 and 15, the outputs of the amplifiers 14 and 15 are signals as represented by wave forms B and C shown in FIG. 2, which signals are identical but are 180° out of phase with each other.

As can be seen from the two wave forms B and C, the rising edge X of the incoming signal A corresponds to the rising edge X of signal B and the falling edge Y of the input signal A corresponds to the rising edge Y of the signal C. Since the two amplifiers 14 and 15 are mirror images of each other and may, for example, be implemented in a CMOS process thereby minimizing process variations, and since both are biased by the same constant current source 16, neither environmental conditions nor power supply fluctuations will have any significant effect on the time interval between the X and Y edges of signals B and C, respectively. In other words, while distortion of the time interval between the rising and falling edges of signals B and C may occur, the time interval between the rising edges X and Y of signals B and C is constrained by the symmetry of the amplifiers.

The outputs B and C of the differential amplifiers 14 and 15 are further conditioned by feeding them into a pair of matched high gain buffers 18 and 19, respectively. The high gain buffers 18 and 19 can each be a simple four transistor Schmitt trigger which square up and amplify outputs B and C, as well as, provide hysteresis for noise immunity in a matter well known in the art. The buffers 18 and 19 may also be implemented in CMOS technology.

The outputs of Schmitt triggers 18 and 19 are represented by wave forms S1 and S2 wherein the falling edge X of the signal S1 corresponds to the rising edge X of the signal B and the falling edge Y of the signal S2 corresponds to the rising edge Y of the signal C. Because the falling edges X and Y in signals S1 and S2, respectively, are generated off the rising edges of signals B and C, even if distortion does occur in the outputs of individual Schmitt triggers as illustrated by the crosshatched portions of the wave shapes S1 and S2, the time interval between the falling edge X in S1 and the falling edge Y in S2 is again constrained by the symmetry of the Schmitt triggers.

When such differential line interface circuit 10 is the front end of a receiver in a transmission system, the outputs S1 and S2 of the two Schmitt triggers 18 and 19 may be further processed by matching symmetrical, synchronizing circuits 20 and 21, respectively, such that the time interval distortion is further constrained by the symmetry of the front end of the synchronizing circuits. Synchronizing circuits 20 and 21 generate synchronized control pulses used in the regeneration of the incoming signal A.

Synchronizing circuit 20 includes a synchronizer or arbiter type DN flip-flop 22; a type D flip-flop 23; a NOT gate 24; and a NOR gate 25. Synchronizing circuit 21 includes a synchronizer or arbiter type DN flip-flop 26; a type D flip-flop 27; a NOT gate 28; and a NOR gate 29.

The output S1 of Schmitt trigger 18 is connected to the DN input of flip-flop 22. The output Q1 of the flip-flop 22 is fed into the input D of flip-flop 23 and to the input of the NOT gate 24. The output of the NOT gate 24 is fed to one input of the dual input NOR gate 25 and the output Q2 of the flip-flop 23 is fed to the second input of the NOR gate 25. The output SET of the NOR gate 25 is fed to the S input of a RS flip-flop 30.

The output S2 of the Schmitt trigger 19 is connected to the DN input of the flip-flop 26. The output Q3 of the flip-flop 26 is fed to the input D of the flip-flop 27 and to the input of the NOT gate 28. The output of the NOT gate 28 is fed to one input of the dual input NOR gate 29, and the output Q4 of the flip-flop 27 is fed to the second input of the NOR gate 29. The output RESET of the NOR gate 29 is fed to the R input of the flip-flop 30.

The flip-flops of the synchronizing circuits 20 and 21, and the RS flip-flop 30, are clocked by a typical clocking signal generated by a receiver clock 40. Synchronizing circuits 20 and 21, RS flip-flop 30 and the receiver clock 40 may also be implemented in CMOS technology.

As can be readily seen from the timing diagrams shown in FIG. 2, the falling edges X and Y of signals S1 and S2 of the two Schmitt triggers 18 and 19, respectively, are synchronized by circuits 20 and 21 with the timing signal generated by the receiver clock 40. Synchronizing circuit 20 in response to the falling edge X of signal S1 and the timing signal of the receiver clock 40 generates a SET control signal which is input to the S input of the RS flip-flop 30 forcing its output Q5 to go high. Synchronizing circuit 21 in response to the falling edge Y of the signal S2 and the timing signal generated by the receiver clock 40 generates a RESET signal which is input to the R input of the RS flip-flop 30 forcing the Q5 output to go low. The output of the RS flip-flop 30 in response to the SET and RESET signals is a reconstructed and synchronized digital signal Q5 wherein any time interval distortion which may be present would be caused by clock resolution.

I claim:

1. An analog to digital interface circuit for transforming an incoming analog signal to a digital signal, the analog signal having a plurality of cells each represented by a wave form having a rising edge (X) and a falling edge (Y) defining a time interval, the interface circuit including:
   a first differential amplifier receiving said incoming signal (A) and providing a first output signal (B) varying in relation to said incoming signal such that the rising edges (X) of the incoming signal corresponds to rising edges (X) of the output signal (B);
   a second differential amplifier receiving said incoming signal (A) and providing a second output signal (C) varying in relation opposite to said incoming signal, said second output signal (C) being identical to said first output signal (B) but 180° out of phase with said first output signal (B), such that the falling edges (Y) of the incoming signal corresponds to rising edges (Y) of said second output signal (C); and
   means responsive to the first and second output signals for generating first and second control signals off the rising edges (X) and (Y) of said first and second output signals signals wherein a time interval between said first and second control signals is substantially equal to the time interval between said rising and falling edges (X) and (Y) of said analog signal (A).

2. An analog to digital interface circuit of claim 1 wherein said first and second differential amplifiers are matched, symmetrical amplifiers.

3. An analog to digital interface circuit of claim 2 wherein said first and second differential amplifiers are implemented in CMOS technology.

4. An analog to digital interface circuit of claim 3 wherein said amplifiers are biased by the same constant current source.

5. An analog to digital interface circuit of claim 1 wherein said means for generating said first and second control signals comprises:
   first means having its input connected to the output of the first differential amplifier for squaring up and inverting said first output signal (B) such that the rising edge (X) of said first output signal (B) corresponds to the falling edge (X) of the inverted signal (S1);
   second means having its input connected to the output of the second differential amplifier for squaring up and inverting said second output signal (C) such that the rising edge (Y) of said second output signal corresponds to the falling edge (Y) of the inverted signal (S2);
   means for generating a time related signal;
   means responsive to said time related signal and the fallling edge (X) of said inverted signal (S1) for generating a SET control signal; and
   means responsive to said time related signal and the falling edge (Y) of said inverted signal (S2) for generating a RESET control signal.

6. An analog to digital interface circuit of claim 5 which further includes means responsive to said SET and RESET control signals for generating a digital output signal corresponding to said analog signal (A).

7. An analog to digital interface circuit of claim 6 wherein said first and second means each comprises a Schmitt trigger.

8. An analog to digital interface circuit of claim 7 wherein said Schmitt triggers are matched, symmetrical four transistor circuits.

9. An analog to digital circuit of claim 1 wherein said means responsive to the first and second signals is implemented in CMOS technology.

10. A receiver for digital signals comprising:
    an analog to digital interface circuit for transforming an incoming analog signal to a digital signal, the incoming signal having a plurality of cells each represented by a wave form having a rising edge (X) and a falling edge (Y), the interface circuit including;
    a first differential amplifier receiving said incoming signal (A) and providing a first output signal (B) varying in relation to said incoming signal such that the rising edge (X) of the incoming signal corresponds to a rising edge (X) of the output signal (B);
    a second differential amplifier receiving said incoming signal (A) and providing a second output signal (C) varying in relation opposite to said incoming signal, said second output signal (C) being identical to said first output signal (B) but 180° out of phase with said first output signal (B), such that the falling edge (Y) of the incoming signal (A) corresponds to a rising edge (Y) of said second output signal (C);

first means having an input connected to an output of the first differential amplifier for squaring up and inverting said first output signal (B) such that the rising edge (X) of said first output signal (B) corresponds to a falling edge (X) of the inverted signal (S1);

second means having an input connected to an output of the second differential amplifier for squaring up and inverting said second output signal (C) such that a rising edge (Y) of said second output signal corresponds to a falling edge (Y) of the inverted signal (S2);

means for generating a time related signal;

means responsive to said time related signal and the falling edge (X) of said inverted signal (S1) for generating a SET control signal;

means responsive to said time related signal and the falling edge (Y) of said inverted signal (S2) for generating a RESET control signal; and means responsive to said time related signal and said SET and RESET control signals generating a digital output signal corresponding to said analog signal (A).

11. A receiver of claim 10 wherein the first and second differential amplifiers are matched, symmetrical amplifiers.

12. A receiver of claim 11 wherein said amplifiers are biased by the same constant current source.

13. A receiver of claim 1 wherein said receiver is implemented in CMOS technology.

* * * * *